(12) United States Patent
Hsieh et al.

(10) Patent No.: US 9,794,907 B1
(45) Date of Patent: Oct. 17, 2017

(54) WIRELESS LOCATION DEVICE

(71) Applicant: HON HAI PRECISION INDUSTRY CO., LTD., New Taipei (TW)

(72) Inventors: Hsin-Pei Hsieh, New Taipei (TW); Fu-Hsin Chiu, New Taipei (TW); Jen-Tsorng Chang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/240,352

(22) Filed: Aug. 18, 2016

(30) Foreign Application Priority Data

May 18, 2016 (TW) .............................. 105115391 A

(51) Int. Cl.
*H04W 24/00* (2009.01)
*H04W 64/00* (2009.01)
*H04W 4/00* (2009.01)
*H05K 9/00* (2006.01)

(52) U.S. Cl.
CPC ........... *H04W 64/00* (2013.01); *H04W 4/008* (2013.01); *H05K 9/0007* (2013.01)

(58) Field of Classification Search
CPC ... A61B 5/1118; A61B 5/6802; A61B 5/0404; A61B 5/0006; A61B 5/0022; A61B 2505/07; A61B 5/02438; A61B 5/0555; A61B 5/1121; A61B 5/1123; H04W 4/008; H04W 64/00; H04W 24/00; H04W 48/04

See application file for complete search history.

(56) References Cited

U.S. PATENT DOCUMENTS

| | | | | |
|---|---|---|---|---|
| 2015/0052617 | A1* | 2/2015 | Zar | A45C 11/00 726/27 |
| 2015/0148100 | A1* | 5/2015 | Malenotti | H04M 1/0254 455/557 |
| 2016/0094947 | A1* | 3/2016 | Shen | H04W 4/008 455/456.1 |
| 2016/0170005 | A1* | 6/2016 | Pon | G01S 5/06 455/456.1 |

* cited by examiner

*Primary Examiner* — Kwasi Karikari
(74) *Attorney, Agent, or Firm* — Steven Reiss

(57) ABSTRACT

A wireless location device comprises a BLUETOOTH beacon configured to emit wireless signals and an electromagnetic shielding cover. The BLUETOOTH beacon is positioned within the electromagnetic shielding cover. The electromagnetic shielding cover comprises an inner surface comprising a plurality of micro-structures, and an opening below the inner surface. The inner surface is configured to reflect towards the opening the wireless signals emitted by the BLUETOOTH beacon which are not directly emitted out of the opening.

12 Claims, 3 Drawing Sheets

WIRELESS LOCATION DEVICE

FIELD

The subject matter generally relates to a wireless location device.

BACKGROUND

Wireless location technologies are widely used for finding and tracking mobile devices (such as smart phones). Typically, a wireless location device may comprise a beacon for emitting wireless signals to a mobile device within a predetermined area. When a mobile device moves within a predetermined area, the mobile device receives a wireless signal from the wireless location device and then transmits a feedback to the wireless location device. Once the wireless location device receives feedback from the mobile device, the wireless location device then determines the location of the mobile device and sends the determined location to the mobile device. However, the wireless transmission is not very effective and noise and degradation greatly reduces the signal quality. Therefore, there is room for improvement in the art.

BRIEF DESCRIPTION OF THE DRAWINGS

Implementations of the present technology will now be described, by way of example only, with reference to the attached figures.

DETAILED DESCRIPTION

Figure 1:
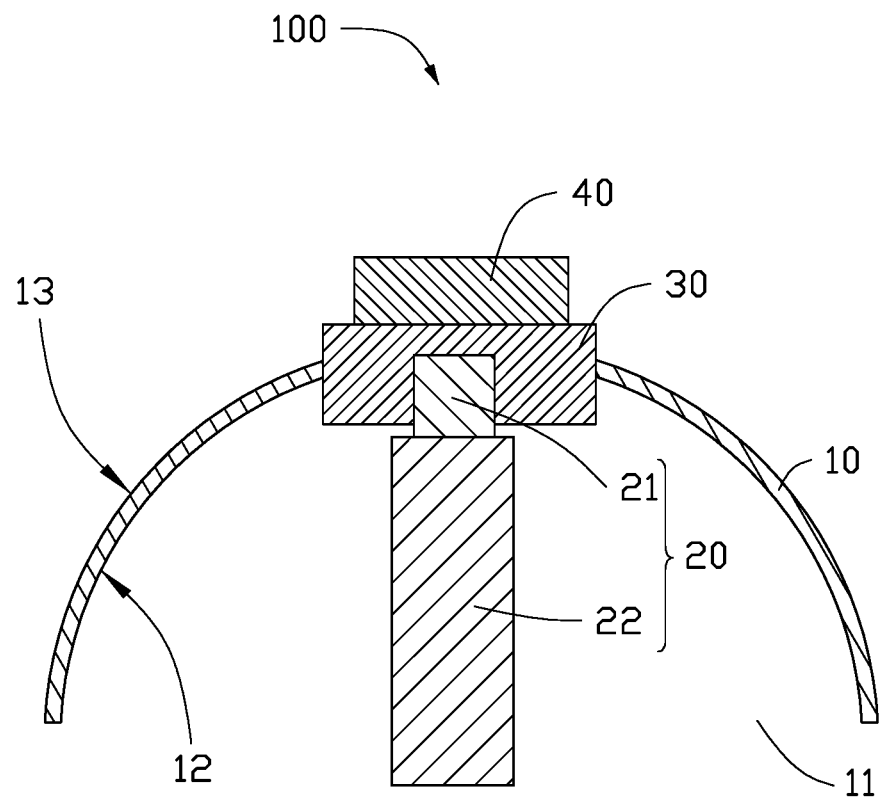
FIG. 1 is a diagrammatic view of a first exemplary embodiment of a wireless location device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

Figure 2:
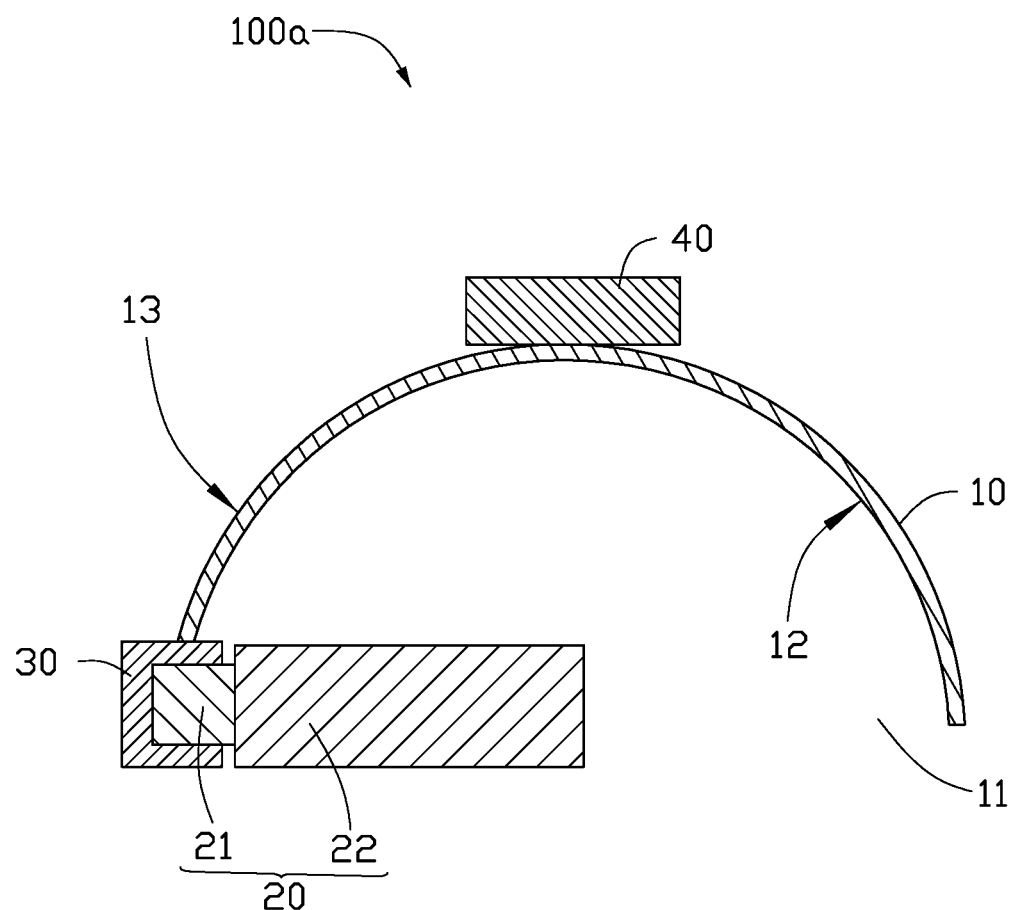
FIG. 2 is a diagrammatic view of a second exemplary embodiment of a wireless location device.

FIGS. 1 and 2 illustrate a wireless location device 100. The wireless location device 100 comprises an electromagnetic shielding cover 10, a BLUETOOTH beacon 20 positioned in the electromagnetic shielding cover 10, at least one power supply component 30 secured to the electromagnetic shielding cover 10, and at least one fixing component 40 secured to and positioned outside the electromagnetic shielding cover 10.

The BLUETOOTH beacon 20 emits wireless signals within a predetermined region.

The electromagnetic shielding cover 10 is hollow and arc-shaped. In at least one exemplary embodiment, the electromagnetic shielding cover 10 is substantially a hollow hemisphere or a hollow cone. In other exemplary embodiments, the electromagnetic shielding cover 10 can have different shapes.

The electromagnetic shielding cover 10 comprises an arc inner surface 12 and an opening 11 below the inner surface 12. The inner surface 12 may reflect the wireless signals emitted by the BLUETOOTH beacon 20 towards the opening 11.

A diameter of the opening 11 and a height of the electromagnetic shielding cover 10 can be adjusted to improve an intensity of the wireless signals emitted from the opening 11. The height of the electromagnetic shielding cover 10 is the distance between a midpoint of the inner surface 12 and a center of the opening 11.

The inner surface 12 is made of metal, thereby preventing the wireless signals emitted by the BLUETOOTH beacon 20 from being transmitted through the inner surface 12. Inner surface 12 also prevents exterior electromagnetic radiations from entering the electromagnetic shielding cover 10.

Figure 3:
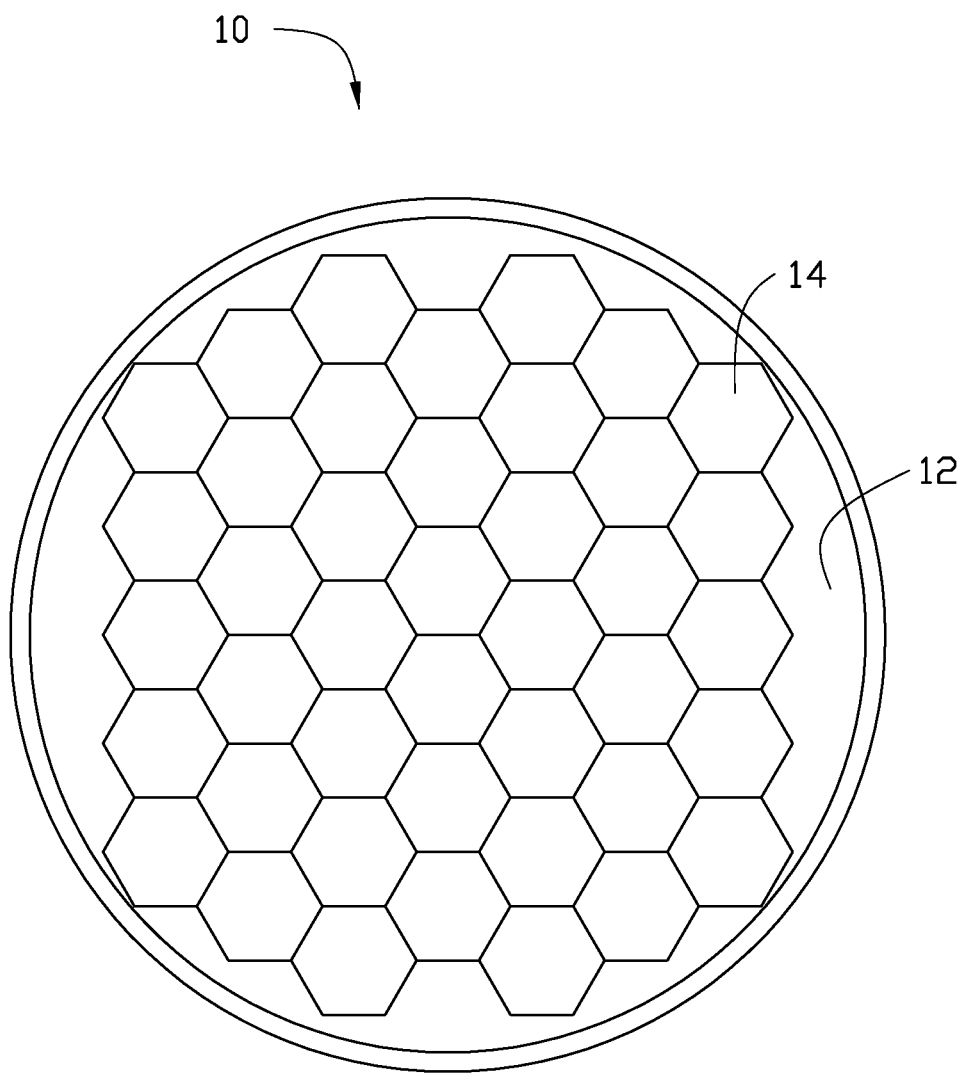
FIG. 3 is a diagrammatic view of an inner surface of an electromagnetic shielding cover that may be included in the wireless location device of FIGS. 1 and 2.

FIG. 3 illustrates the inner surface 12 of the electromagnetic shielding cover 10 comprises a plurality of micro-structures 14. The micro-structures 14 may be recessed structures or projecting structures on the inner surface 12. In at least one exemplary embodiment, the micro-structure 14 is polygonal, hexagonal, or circular. The intensity of the wireless signal emitted out from the opening 11 of the electromagnetic shielding cover 10 may be improved by adjusting a shape, a size, or an area density of the micro-structures 14.

In this exemplary embodiment, the BLUETOOTH beacon 20 has low power consumption. The BLUETOOTH beacon 20 comprises a securing portion 21 and an emitting portion 22 secured to the securing portion 21. The emitting portion 22 emits the wireless signals.

In at least one exemplary embodiment, the securing portion 21 is secured to the power supply component 30. The power supply component 30 supplies power to the BLUETOOTH beacon 20.

In other exemplary embodiments, the securing portion 21 may be directly secured to the electromagnetic shielding cover 10. The BLUETOOTH beacon 20 and the power supply component 30 may be electrically connected to each other by wires (not shown).

Referring to FIG. 1, the securing portion 21 is secured to the midpoint of the inner surface 12, and the emitting portion 22 is located along an imaginary central line of the electromagnetic shielding cover 10. As such, more wireless signals from the emitting portion 22 are reflected by the inner surface 12 towards the opening 11, thus increasing the intensity of wireless signals emitted out from the electromagnetic shielding cover 10.

In at least one exemplary embodiment, the power supply component 30 comprises a battery (not shown). The battery may be a lithium ion battery or a solar cell. The power supply component 30 is detachably secured to the electromagnetic shielding cover 10, thus the battery can be changed easily.

In other exemplary embodiments, the power supply component 30 is electrically connected to an external power supply device (not shown).

The electromagnetic shielding cover 10 further comprises an outer surface 13 opposite to the inner surface 12. The fixing component 40 can be secured to any location of the outer surface 13. Referring to FIG. 1, in at least one exemplary embodiment, the fixing component 40 is secured to a midpoint of the outer surface 13.

In at least one exemplary embodiment, the fixing component 40 and the power supply component 30 are fixed together and secured to a same location of the electromagnetic shielding cover 10. Referring to FIG. 1, in a first exemplary embodiment of wireless location device 100, the fixing component 40 is fixed to the midpoint of the outer surface 13, and the power supply component 30 is fixed to the midpoint of the inner surface 12.

In other exemplary embodiments, the fixing component 40 and the power supply component 30 are fixed to different locations of the electromagnetic shielding cover 10. Referring to FIG. 2, in a second exemplary embodiment of wireless location device 100a, the fixing component 40 is fixed to the midpoint of the outer surface 13, and the power supply component 30 is fixed to an edge of the inner surface 12.

In at least one exemplary embodiment, the fixing component 40 may be a screw. The wireless location device 100 can be fixed to a wall, a ceiling, or any other surface by the screw.

In at least one exemplary embodiment, the fixing component 40 may be an adsorbent member. The adsorbent member may be a suction cup. The wireless location device 100 is fixed to a wall, a ceiling, or any other surface by the adsorbent member.

When in use, the wireless location device 100 is fixed to a surface by the fixing component 40, with the opening 11 facing a predetermined region. When the wireless location device 100 is powered on, the BLUETOOTH beacon 20 emits the wireless signals within the predetermined region. A portion of the wireless signals is emitted directly towards the opening 11 and out of the electromagnetic shielding cover 10, the other portion of the wireless signals is reflected by the inner surface 12 towards the opening 11. When a mobile device (such as telephone, a tablet computer, or a smart watch, not shown) moves within the predetermined region, the mobile device can obtain its own location from the wireless location device 100. Furthermore, the mobile device can alarm a user of the mobile device by vibrating or generating sound in the event that the mobile device is in a location deemed dangerous.

What is claimed is:
1. A wireless location device comprising:
   a BLUETOOTH beacon, wherein the BLUETOOTH beacon emits wireless signals; and
   an electromagnetic shielding cover, wherein the BLUETOOTH beacon is positioned in the electromagnetic shielding cover, the electromagnetic shielding cover comprising:
   an inner surface comprising a plurality of micro-structures; and
   an opening below the inner surface;
   wherein the inner surface reflects the wireless signals emitted by the BLUETOOTH beacon towards the opening;
   wherein the intensity of the wireless signals emitted out from the opening of the electromagnetic shielding cover may be improved by adjusting a shape, a size, or an area density of the micro-structures;
   wherein the opening faces a predetermined region and emits the wireless signals within the predetermined region; and
   wherein when a mobile device moves within the predetermined region the mobile device can obtain its own location from the wireless location device.

2. The wireless location device of claim 1, wherein the plurality of micro-structures is a plurality of recessed structures or a plurality of projection structures on the inner surface.

3. The wireless location device of claim 1, wherein the shape of the micro-structure is substantially polygonal, hexagonal or circular.

4. The wireless location device of claim 1, wherein the electromagnetic shielding cover is hollow and substantially arc-shaped.

5. The wireless location device of claim 4, wherein the electromagnetic shielding cover is hollow hemisphere or hollow cone.

6. The wireless location device of claim 1, further comprising a power supply component, wherein the power supply component is configured to supply electric energy to the BLUETOOTH beacon.

7. The wireless location device of claim 6, wherein the BLUETOOTH beacon comprises a securing portion and an emitting portion secured to the securing portion, the emitting portion emits the wireless signals.

8. The wireless location device of claim 7, wherein the securing portion is secured to the power supply component, thereby securing the BLUETOOTH beacon to the power supply component, the BLUETOOTH beacon and the power supply component are electrically connected to each other.

9. The wireless location device of claim 7, wherein the securing portion is directly secured to the electromagnetic shielding cover, the BLUETOOTH beacon and the power supply component are electrically connected to each other.

10. The wireless location device of claim 6, wherein the power supply component comprises a battery which supplies power to the BLUETOOTH beacon.

11. The wireless location device of claim 1, wherein the wireless location device further comprising at least one fixing component, wherein the electromagnetic shielding cover further comprises an outer surface opposite to the inner surface, and wherein the fixing component is secured to the outer surface.

12. The wireless location device of claim 11, wherein the fixing component is screw or a suction cup.

* * * * *